United States Patent [19]

Moulding et al.

[11] 4,290,036
[45] Sep. 15, 1981

[54] FILTER CIRCUIT ARRANGEMENT

[75] Inventors: Kenneth W. Moulding, Horley; Gordon A. Wilson, Reigate, both of England

[73] Assignee: U.S. Philips Corporation, New York, N.Y.

[21] Appl. No.: 144,729

[22] Filed: Apr. 28, 1980

[30] Foreign Application Priority Data

Apr. 30, 1979 [GB] United Kingdom ............... 15009/79

[51] Int. Cl.³ .......................................... H03H 11/08
[52] U.S. Cl. .................................... 333/215; 330/109
[58] Field of Search ................ 333/175, 215, 107, 109

[56] References Cited

U.S. PATENT DOCUMENTS 3,559,105 1/1971 Kurth ............................. 333/215 X

FOREIGN PATENT DOCUMENTS 647853 2/1979 U.S.S.R. ............................... 333/215

Primary Examiner—Paul L. Gensler
Attorney, Agent, or Firm—Thomas A. Briody; William J. Streeter; Edward W. Goodman

[57] ABSTRACT

In a filter circuit a reactance is simulated by a voltage amplifier the input of which is connected across a reactive element and the output of which is connected in series with that element, thereby enabling, for example, the series arrangement of a pair of inductances to be simulated by a single capacitively-loaded gyrator (15, 16, 7) and a voltage amplifier (15, 8). The circuit shown simulates a series-resonant circuit fed via a series inductor and is suitable for use as a sound trap in a television receiver. A current proportional to the voltage across the unloaded port (8) of the gyrator (15, 16) generates a corresponding voltage across a load resistor (12) and this voltage is injected effectively in series with any voltage present across a pair of input terminals (1, 2) by means of a differential voltage amplifier (13).

4 Claims, 6 Drawing Figures

FILTER CIRCUIT ARRANGEMENT

BACKGROUND OF THE INVENTION

This invention relates to a filter circuit arrangement comprising a reactive element and an electronic reactance circuit, said electronic reactance circuit comprising an amplifier arrangement to the input of which said reactive element is coupled and the output of which is coupled to said reactive element.

It is known (see, for example, the book "Radio Designer's Handbook" (Iliffe) 4th Edition, pages 1156–1160) that the effective value of a reactive element, for example an inductor, can be modified by connecting the anode-cathode path of a valve in parallel with the element, and feeding the voltage across the reactive element to the control grid of the valve via a 90° phase-shifting network, so that the anode-cathode path of the valve carries a signal current which is in phase or anti-phase with the current through the reactive element (if the reactive element is a pure capacitance or a pure inductance). The valve therefore acts as a further reactance (either capacitive or inductive depending on the sense in which the shift occurs in the phase-shifting network) in parallel with the reactive element.

A television receiver circuit normally requires the presence of a so-called "sound trap" filter in its video channel in order to prevent audio signals from affecting the display, the audio signals being conventionally transmitted in the form of frequency-modulation of a subcarrier situated just above the highest transmitted video modulation frequency. This sound trap filter is normally in the form of a so-called "notch" filter tuned to the sound subcarrier frequency (conventionally 6 MHz or 5.5. MHz) and, in order that the frequency response of the video channel should be correct for the video signals, it is normally required that the transmission factor of the notch filter should be substantially constant for the whole of the frequency range of the video signals, i.e. its response should be substantially flat for frequencies up to a frequency just below that at which the notch occurs.

If the notch filter were constituted by a simple series-resonant circuit comprising a single inductor and a single capacitor connected in series across the input signal source impedance the transmission factor of the filter would be liable to start to fall at frequencies well below that at which the notch is situated, i.e. at frequencies within the video signal band, with the result that the higher frequency components of the video output signal from the filter would be liable to be degraded. A higher order filter is therefore desirable. One form of such a higher order filter is shown in FIG. 1 of the accompanying diagrammatic drawings, a second inductor $L_2$ being included in the input signal path to a conventional series-tuned circuit constituted by a first inductor $L_1$ and a capacitor C. The values of inductor $L_1$ and capacitor C are chosen so that the resonant circuit formed thereby resonates at the sound subcarrier frequency, creating a notch in the transmission factor of the filter at this frequency, and the value of inductor $L_2$ is chosen so that a pole is created in the response of the filter at a frequency just below this frequency. The result is that the transmission factor V/E of the filter varies with frequency f in a manner having the general form shown in FIG. 2, in which $f_2$ denotes the sound subcarrier frequency, and in which the response which would be obtained at frequencies below $f_s$ if the inductor $L_2$ were replaced by a simple resistor is shown as a dashed line. The height of the peak occurring in the response just below $f_s$ and the actual frequency at which this occurs can of course be adjusted by varying the value of the inductor $L_2$ and the "Q" of the circuit, in order to obtain the most satisfactory approximation to the response ideally required.

Nowadays it is highly desirable that as much as possible of television receiver circuitry be constructed in integrated circuit form in the interests of reliability, reproducibility and economy. One form of component which it is very difficult to manufacture in this way is a conventional inductor, and it is desirable that, if possible, any inductive element required be constructed in an alternative way which lends itself more readily to fabrication by integrated circuit techniques.

It is known that an inductor can be replaced by the driving point impedance of a capacitively-loaded gyrator circuit, i.e. the driving point impedance of a capacitively loaded two-port for which the admittance matrix is ideally $$\begin{vmatrix} 0 & -g \\ +g & 0 \end{vmatrix}$$

A gyrator circuit may be formed, for example, by interconnecting a pair of voltage-controlled current sources, one of which is inverting from input to output and the other of which is non-inverting from input to output, in such manner that the input of each source, is connected in parallel with the output of the other source, each resulting commoned input of one source and output of the other source constituting one port of the gyrator. As another example, a gyrator circuit may be formed by interconnecting a pair of current-controlled voltage sources, one of which is inverting from input to output and the other of which is non-inverting from input to output, in such manner that the input of each source is connected in series with the output of the other source, each resulting series combination of the input of one source and the output of the other source constituting one port of the gyrator. Thus each inductor $L_1$ and $L_2$ of FIG. 1 could be replaced by the driving point impedance of a respective capcitively loaded gyrator, thereby making the filter circuit more amenable to fabrication by integrated circuit techniques. However, each gyrator would require a considerable area on the semiconductor chip on which the filter circuit (and ideally as large a proportion as possible of the other parts of the television receiver circuitry) is fabricated, which may result in either the use of a larger chip than is desirable from the point of view of reliable manufacture, or the omission therefrom of other parts of the receiver circuitry which would otherwise be provided thereon.

SUMMARY OF THE INVENTION

It is an object of the invention to mitigate this disadvantage.

The invention provides a filter circuit arrangement comprising a reactive element and an electronic reactance circuit, said electronic reactance circuit comprising an amplifier arrangement to the input of which said reactive element is coupled and the output of which is coupled to said reactive element, characterised in that the amplifier arrangement is a voltage amplifier arrangement and in that the output thereof is connected effectively in series with a signal path through said reactive element.

It has now been recognized that a reactance can be simulated by a voltage amplifier the input of which is connected across a given reactive element and the output of which is connected in series with that reactive element. If the voltage amplifier is ideal, i.e. if it has zero output impedance, the voltage across its output terminals can be exactly in phase with that across the reactive element, with the result that the series combination of the output circuit and the reactive element behaves as the series arrangement of two reactances of the same kind (inductances or capacitances, parallel or series resonant circuits, etc. depending on the nature of the reactive element) one of which may be either positive or negative depending on the sense in which the amplifier output is connected in the signal path through the reactive element. Effectively forming a series arrangement of two reactances of the same kind in this way can be useful, for example, when it is desired to produce a filter circuit the response of which approaches that of the arrangement of FIG. 1 (which includes the series arrangement of inductors $L_1$ and $L_2$). Moreover, the possibility of simulating a negative reactance can be useful in certain circumstances.

The reactive element may be an inductive element constituted by a first port of a gyrator circuit the second port of which is capacitively loaded, in which case the series arrangement of first and second inductive elements may be effectively formed by the combination of this gyrator circuit and the reactance circuit. This can be a simpler arrangement than if the two inductive elements were constituted by separate capacitively loaded gyrator circuits.

If the reactive element, is such an inductive element a capacitive element may be included in series in said signal path through this inductive element, first means may be provided for presenting an input signal voltage across the series arrangement of the inductive element, the capacitive element and the amplifier output, second means may be provided for deriving an output signal voltage from across a series arrangement formed by said capacitive element and either said inductive element or the amplifier output, and the amplifier output may be connected in the first-mentioned series arrangement in such a sense that, within this series arrangement, the signal voltage occurring across said output when said input signal voltage is present, will be in phase with the signal voltage occurring across said inductive element. A filter arrangement equivalent to that shown in FIG. 1 may be created in this way which, as mentioned previously, is an attractive arrangement for use as a "sound-trap" in a television receiver.

Construction of such a filter arrangement in integrated circuit form may be facilitated if the gyrator circuit comprises first and second voltage-controlled current sources one of which is inverting and one of which is non-inverting, the input of each source being connected to the output of the other source, if a given source is provided with a further output and is constructed to generate an output current thereat in anti-phase to the current generated thereby at its first-mentioned output, if said output current is passed through a resistance, and if the voltage appearing across said resistance is combined with said input signal voltage, said amplifier arrangement then comprising said given source and said resistance. Because it is desirable that a circuit constructed in integrated circuit form be designed so that its overall properties are as little sensitive as possible to production spreads occurring in the manufacture of the circuit, it is often desirable to construct any amplifier which may be present, in a balanced manner, for example so that it comprises a so-called "long-tailed pair" of transistors. In general, such an amplifier will have two outputs which are driven in anti-phase and, if the aforesaid voltage-controlled current sources are constructed in such a manner, said further output will be present anyway, so that the electronic reactance circuit can in principle be formed using very few additional components.

DESCRIPTION OF THE DRAWINGS

Embodiments of the invention will now be described, by way of example, with reference to the accompanying diagrammatic drawings in which.

DESCRIPTION OF THE PREFERRED EMBODIMENTS

Figure 3:
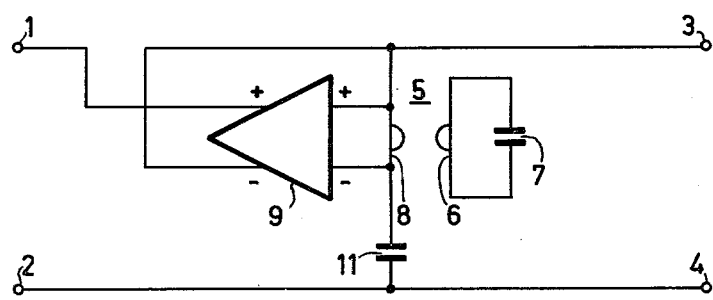
FIG. 3 shows the general form of a first embodiment of the invention.

In FIG. 3 a filter circuit arrangement comprises a pair of input terminals 1, 2 to which an input signal is applied, a pair of output terminals 3, 4 from which an output signal is derived, a gyrator circuit 5 across one port 6 of which a capacitor 7 is connected and across the other port 8 of which is connected the input of a voltage amplifier 9. The output of amplifier 9 is connected in series with the signal path between input terminals 1 and 2, which signal path extends through the port 8 of gyrator 5 and through a series capacitor 11. The relative senses of the input and output signals of amplifier 9 are denoted in conventional manner by plus and minus signs adjacent the various input and output terminals thereof, from which it will be seen that the output of amplifier 9 is connected in the series arrangement, constituted by said output, the port 8 and the capacitor 11, in such a sense that, within this series arrangement, the signal voltage occurring across said output when an input signal voltage is applied across terminals 1 and 2 will be in phase with the voltage occurring across port 8. The series combination of port 8 and capacitor 11 is connected across the output terminals 3 and 4.

Figure 1:
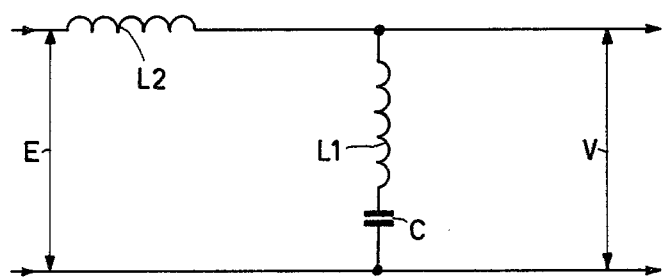
FIG. 1 shows the aforementioned filter circuit comprising discrete inductive elements.
Figure 2:
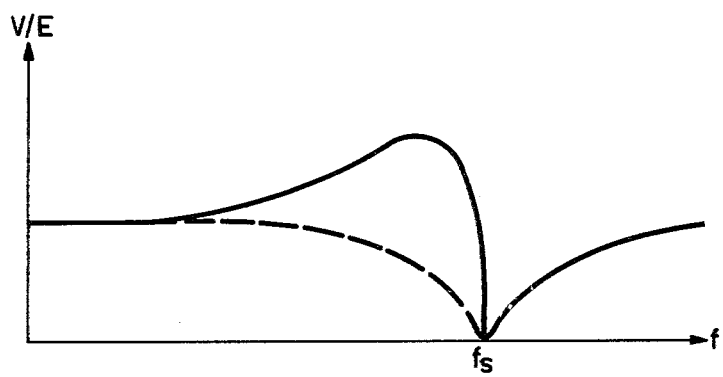
FIG. 2 shows the aforementioned possible transmission factor versus frequency characteristic of the circuit of FIG. 1.

As mentioned previously, because the port 6 of gyrator circuit 5 is loaded by capacitor 7, the impedance of port 8 of gyrator 5 is inductive and thus corresponds to inductor $L_1$ of FIG. 1, capacitor 11 corresponding to capacitor C of FIG. 1. Because the output voltage of amplifier 9 is proportional to and in phase with any voltage across the (inductive) port 8 of gyrator 5, and the current through the output circuit of amplifier 9 is equal to and in phase with any current through the inductive port 8 (assuming the ideal case where the output impedance of amplifier 9 is negligible, as is any load connected across output terminals 3, 4) the output circuit of amplifier 9 effectively constitutes an extension of the inductance effectively present at port 8, this extension being positive (because of the sense in which the output of amplifier 9 is connected in circuit) and therefore corresponding to the inductive element $L_2$ of FIG. 1. It will be seen, therefore, that a filter arrangement, the response of which corresponds to that of the arrangement of FIG. 1, has been realised using only one capacitively loaded gyrator, the inductor $L_2$ being simulated by means of the electronic reactance circuit constituted by the amplifier 9. Of course, the output of amplifier 9 could be connected in the circuit in the opposite sense, in which case a negative inductance would be simulated. This would result in a transmission factor versus frequency characteristic similar to that shown in FIG. 2 but with the peak transferred to the high-frequency side of frequency $f_s$.

It will be appreciated that, as an alternative, the port 8 of gyrator circuit 5 and the output of amplifier 9 may be interchanged, so that port 8 is included between terminals 1 and 3 and the amplifier output is included between terminal 3 and capacitor 11, the input of amplifier 9 being connected across port 8 in its new position.

Of course, it is possible to simulate reactances other than inductances in an analogous manner. For example, if the input of amplifier 9 of FIG. 3 were transferred to across capacitor 11, the amplifier output circuit would effectively constitute a capacitance (positive or negative) and the arrangement would then correspond to that of FIG. 1 but with inductor $L_2$ replaced by a capacitor and modifying the transmission factor versus frequency characteristic accordingly. As another example, if a further capacitor were connected across port 8 of gyrator 5 the amplifier output circuit would effectively constitute the parallel arrangement of an inductor and a capacitor.

Obviously, the value of the reactance simulated will depend on the value of the reactive element across which the amplifier input is connected and on the gain of the amplifier.

Figure 4:
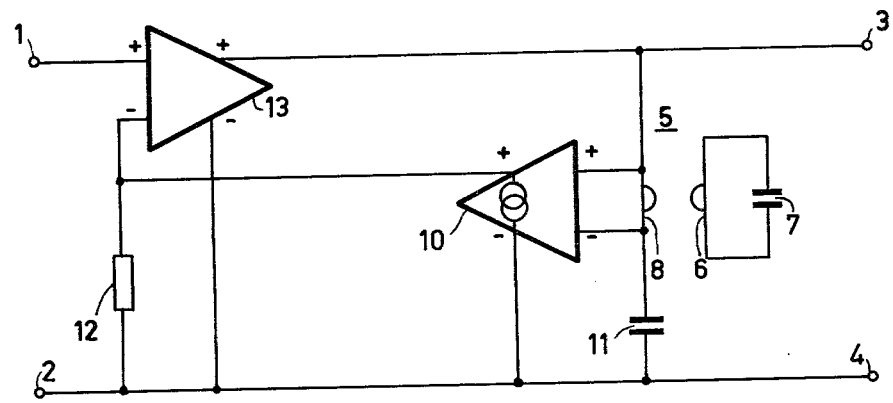
FIG. 4 shows the general form of a second embodiment of the invention.

FIG. 4 shows a second embodiment of the invention in which the simple voltage amplifier 9 of FIG. 3 has been replaced by a voltage amplifier arrangement comprising the combination of a voltage-controlled current source 10 and a load resistor 12. The input terminal 1 is now connected to the non-inverting input of a differential voltage amplifier 13, the non-inverting output of which is coupled to the port 8 of gyrator 5 and to the output terminal 3. The common point of the non-inverting output of source 10 and the load resistor 12 is connected to the inverting input of amplifier 13. The load resistor 12, i.e. the output of voltage amplifier arrangement 10, 12, is thus connected in series with the signal path from input terminals 1, 2 to the input of amplifier 13, i.e. in series with the input signal path through (inductive) port 8. It will be seen moreover, that the output of arrangement 10, 12 is connected in the series arrangement, effectively constituted by said output, the port 8 and the capacitor 11, in such a sense such that, within this series arrangement, the signal voltage occurring across said output when a signal voltage is applied across terminals 1 and 2 will be in phase with the voltage occurring across port 8. Thus again the voltage amplifier arrangement 10, 12 effectively constitutes a positive inductance in the input signal path to the inductive port 8, i.e. a filter arrangement the response of which corresponds to that of the arrangement of FIG. 1 has again been realised using only one capacitively-loaded gyrator.

It will be appreciated that, if an input signal source (not shown) connected across terminals 1 and 2 of FIG. 4 has an appreciable internal resistance, the load resistor 12 may be replaced by this resistance, in which case differential voltage amplifier 13 may be omitted, terminal 1 then being connected directly to port 8 and output terminal 3, and the output of source 10 then being connected across terminals 1 and 2 in such manner that the non-inverting output (+) of source 10 is connected to terminal 2 and the inverting output of source 10 is connected to terminal 1.

Figure 5:
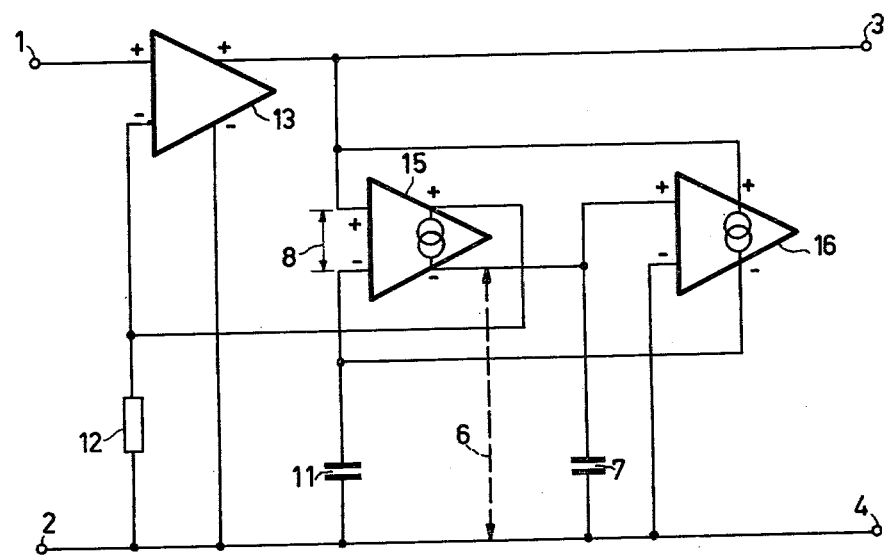
FIG. 5 shows a modified form of the embodiment of FIG. 4 in more detail, and, FIG. 6 shows a practical version of the embodiment of FIG. 5 in more detail.

FIG. 5 shows a modified version of the construction of FIG. 4 in more detail. More specifically the gyrator circuit 5 of FIG. 4 is shown as being constructed from a pair of voltage-controlled current sources 15 and 16, respectively, each having both a non-inverting (+) and an inverting (−) input and both a non-inverting (+) and an inverting (−) output. The inverting output of source 15 is connected to the non-inverting input of source 16, the non-inverting output of source 16 is connected to the non-inverting input of source 15, and the inverting output of source 16 is connected to the inverting input of source 15. A gyrator circuit is therefore formed, one port 8 thereof existing between the non-inverting and inverting inputs of source 15 and the other port 6 thereof existing between the non-inverting and inverting inputs of source 16. Capacitor 7 is connected across port 6 and capacitor 11 is connected between one terminal of port 8 and ground, as in FIG. 4. The source 10 of FIG. 4 is in FIG. 5 constituted by the path through source 15 from its input terminals to its non-inverting output terminal. Of course the port 8 and the capacitor 11 may be interchanged if desired, as they may be in the arrangements of FIGS. 3 and 4.

Figure 6:
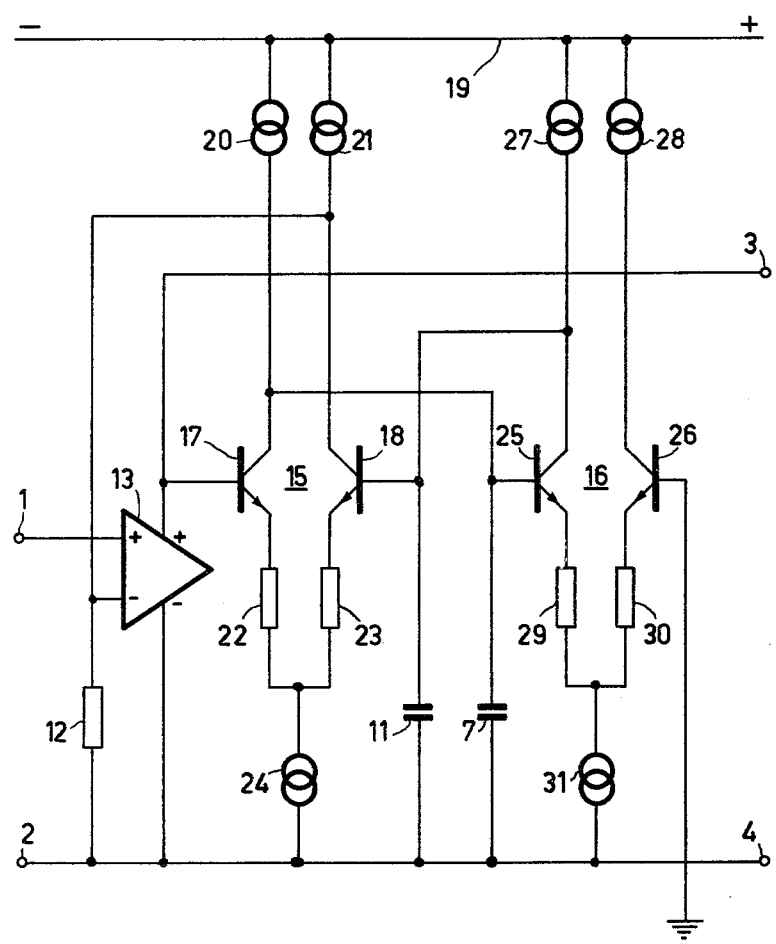

The embodiments of FIG. 5 may be constructed in practice in the manner indicated in more detail in FIG. 6. In FIG. 6 the source 15 of FIG. 5 is formed by a long-tailed pair of transistors 17 and 18, respectively, the collectors of which are fed from a positive supply rail 19 via current sources 20 and 21, respectively, and the emitters of which include series resistors 22 and 23, respectively. The common point of these resistors 22, 23 is connected to ground via a current source 24. Similarly, in FIG. 6, the source 16 of FIG. 5 is formed by a long-tailed pair of transistors 25 and 26, respectively, the collectors of which are fed from supply rail 19 via current sources 27 and 28, respectively, and the emitters of which include series resistors 29 and 30, respectively. The common point of these resistors 29, 30 is connected to ground via a current source 31. The base of transistor 17 is connected to the collector of transistor 26 and to the output terminal 3. The base of transistor 18 is connected to ground via capacitor 11 and to the collector of transistor 25. The base of transistor 25 is connected to ground via capacitor 7 and also to the collector of transistor 17. The base of transistor 26 is connected to ground. The collector of transistor 18 is connected to earth via resistor 12 and also to the inverting input of differential voltage amplifier 13.

In practice the base of each transistor 17, 18, 25, 26 may be fed via an individual emitter-follower (not shown) having an emitter load resistor the value of which is in the order of, for example, 10 kohms. Such emitter followers can provide d.c. level shifts where required because of the d.c. couplings used. The values of each of the resistors 22, 23, 29 and 30 may be, for example, in the order of 1 kohm. The various "constant" current sources may be constituted, for example, by high-value resistors, suitably biassed transistors in common-emitter mode (pnp transistors for the sources 20, 21, 27 and 28 and npn transistors for the sources 24 and 31) or depletion mode FETs having their gates connected to their sources (p-channel FETs for the sources 21, 22, 27 and 28 and n-channel FETs for the sources 24 and 31). The value of resistor 12 determines the gain of the voltage amplifier arrangement formed by the signal path through voltage-controlled current source 15 to its non-inverting output (collector of transistor 18) and resistor 12, i.e. it determines the relative values of the inductance formed by the capacitively loaded gyrator circuit 15, 16 and the inductance simulated by the voltage amplifier arrangement. Obviously the value of this resistance should be chosen so that the peak in the response curve of FIG. 2 lies at the correct frequency relative to the notch frequency $f_s$.

The notch frequency $f_s$ is determined in known manner by the values of capacitor 11 and the inductance formed by the capacitively loaded gyrator circuit. This frequency is ideally given by $$f_s = \frac{1}{2\pi} g_o (C_7 C_{11})^{-\frac{1}{2}}$$

where $C_7$ and $C_{11}$ are the values of capacitors 7 and 11, respectively, and $g_o$ is the magnitude of the transconductance of each voltage-controlled current source 15, 16 (assuming that each source has the same transconductance, which is ideally, but not necessarily, the case). At high frequencies the above ideal expression for $f_s$ may be modified by the presence of parasitic reactances.

The "Q" factors of the arrangements of FIGS. 3–6 may be reduced as required by inserting a resistor in series with the output circuit of amplifier 9 of FIG. 3 or in series with the output of amplifier 13 in FIGS. 4–6, thereby adjusting the width of the notch in the response of the arrangement to the value required.

We claim:

1. A filter circuit arrangement comprising an inductive element and an electronic reactance circuit, said electronic reactance circuit comprising an amplifier arrangement the input of which is connected across said inductive element and the output of which is coupled to said inductive element, characterised in that said inductive element is constituted by a first port of a gyrator circuit the second port of which is capacitively loaded, in that said amplifier arrangement, is a voltage amplifier arrangement, the output circuit of which is connected effectively in series with an input signal path through said inductive element in such manner that said output circuit is external to the circuit loop which includes the reactive element and the input circuit of the voltage amplifier, in that a capacitive element is included in series in said input signal path, in that first means are provided for presenting an input signal path, in that first means are provided for presenting an input signal voltage across the effective series arrangement of the inductive element, the capacitive element and said output circuit, in that second means are provided for deriving an output signal voltage from across a part of said series arrangement which includes said capacitive element and said inductive element, and in that said output circuit is connected in said series arrangement in such a sense that, within this series arrangement, the signal voltage produced across said output circuit by the voltage amplifier when said input signal voltage is present will be in phase with the signal voltage occurring across said inductive element.

2. A filter circuit arrangement as claimed in claim 1, wherein said second means derives said output signal voltage from across a part of said series arrangement which includes said capacitive element and said output circuit.

3. A filter circuit arrangement as claimed in claim 1 or 2 characterized in that said gyrator circuit comprises first and second voltage-controlled current sources, one of which is inverting and the other of which is non-inverting, the input of each of said sources being connected to the output of the other of said sources, in that one of said sources is provided with a further output and is constructed to generate an output current thereat in anti-phase to the current generated thereby at its first-mentioned output, in that said output current is passed through a resistance and in that the voltage appearing across said resistance is combined with said input signal voltage, so that said amplifier arrangement comprises said one of said sources and said resistance.

4. A filter circuit arrangement as claimed in claim 1 or 2, wherein said output circuit is connected in said series arrangement in such a sense that, within this series arrangement, the signal voltage produced across said output circuit by the voltage amplifier when said input signal voltage is present, will be in anti-phase to the signal voltage occurring across said inductive element.

* * * * *